(12) United States Patent
Bradshaw et al.

(10) Patent No.: US 6,650,636 B1
(45) Date of Patent: Nov. 18, 2003

(54) TRANSMISSION AND RECEPTION OF TCP/IP DATA OVER A WIRELESS COMMUNICATION CHANNEL

(75) Inventors: Steven H. Bradshaw, Escondido, CA (US); Bruce L. Carneal, Del Mar, CA (US); Karl E. Moerder, Poway, CA (US); Michael J. Theiss-Aird, Carlsbad, CA (US)

(73) Assignee: Tachyon, Inc., San Diego, CA (US)

( * ) Notice: Subject to any disclaimer, the term of this patent is extended or adjusted under 35 U.S.C. 154(b) by 0 days.

(21) Appl. No.: 09/421,961

(22) Filed: Oct. 20, 1999

Related U.S. Application Data

(63) Continuation-in-part of application No. 09/407,646, filed on Sep. 28, 1999, now abandoned.
(60) Provisional application No. 60/151,282, filed on Aug. 27, 1999.

(51) Int. Cl.$^7$ ................................................ H04L 12/66
(52) U.S. Cl. ...................... 370/352; 370/474; 370/522; 725/63
(58) Field of Search ................................. 370/270, 277, 370/310, 312, 352, 389, 392, 466, 474, 522; 725/63, 67–68, 71

(56) References Cited

U.S. PATENT DOCUMENTS

| | | |
|---|---|---|
| 3,611,435 A | 10/1971 | Cooper |
| 3,818,453 A | 6/1974 | Schmidt et al. |
| 4,543,574 A | 9/1985 | Takagi et al. |
| 4,545,061 A | 10/1985 | Hileman |
| 4,555,782 A | 11/1985 | Alaria et al. |
| 4,736,371 A | 4/1988 | Tejima et al. |
| 4,763,325 A | 8/1988 | Wolfe et al. |
| 4,774,707 A | 9/1988 | Raychaudhuri |
| 4,811,200 A | 3/1989 | Wagner et al. |
| 4,837,786 A | 6/1989 | Gurantz et al. |
| 4,841,527 A | 6/1989 | Raychaudhuri et al. |
| 4,868,795 A | 9/1989 | McDavid et al. |
| 5,012,469 A | 4/1991 | Sardana |

(List continued on next page.)

FOREIGN PATENT DOCUMENTS

| | | |
|---|---|---|
| EP | 0 026 603 | 4/1981 |
| EP | 0 097 309 | 1/1984 |
| EP | 0 501 699 A2 | 9/1992 |
| EP | 0 584 820 A1 | 3/1994 |
| EP | 0 722 228 A2 | 7/1996 |
| EP | 0 755 164 A2 | 1/1997 |
| EP | 0 889 660 A2 | 1/1999 |
| EP | 0 889 664 A2 | 1/1999 |
| EP | 0 901 253 A2 | 3/1999 |
| EP | 0 912 015 A2 | 4/1999 |
| EP | 0 912 016 A2 | 4/1999 |
| EP | 0 913 968 A1 | 5/1999 |
| EP | 0 913 970 A1 | 5/1999 |
| EP | 0 915 592 A1 | 5/1999 |
| EP | 0 917 317 A1 | 5/1999 |

(List continued on next page.)

*Primary Examiner*—Chau Nguyen
*Assistant Examiner*—Nittaya Juntima
(74) *Attorney, Agent, or Firm*—Knobbe, Martens, Olson & Bear, LLP

(57) ABSTRACT

Transmission of TCP/IP data over a satellite link from a hub station to a plurality of remote units. The data, transmitted over the satellite link, uses the digital video broadcast (DVB) protocol. A field in the DVB header is used to indicate the location of the start of a new TCP/IP data packet within the DVB data. Use of a field in the DVB header to indicate the location of the start of a new TCP/IP data packet supports variable location of TCP/IP data within a DVB frame, and therefore more efficient use of the DVB bandwidth.

8 Claims, 10 Drawing Sheets

U.S. PATENT DOCUMENTS

| | | |
|---|---|---|
| 5,121,387 A | 6/1992 | Gerhardt et al. |
| 5,159,592 A | 10/1992 | Perkins |
| 5,166,929 A | 11/1992 | Lo |
| 5,172,375 A | 12/1992 | Kou |
| 5,216,427 A | 6/1993 | Yan et al. |
| 5,239,677 A | 8/1993 | Jasinski |
| 5,276,703 A | 1/1994 | Budin et al. |
| 5,297,144 A | 3/1994 | Gilbert et al. |
| 5,345,583 A | 9/1994 | Davis |
| 5,381,443 A | 1/1995 | Borth et al. |
| 5,384,777 A | 1/1995 | Ahmadi et al. |
| 5,420,864 A | 5/1995 | Dahlin et al. |
| 5,446,736 A | 8/1995 | Gleeson et al. |
| 5,471,473 A | 11/1995 | Tejima |
| 5,485,464 A | 1/1996 | Strodtbeck et al. |
| 5,490,087 A | 2/1996 | Redden et al. |
| 5,537,397 A | 7/1996 | Abramson |
| 5,539,730 A | 7/1996 | Dent |
| 5,541,924 A | 7/1996 | Tran et al. |
| 5,550,992 A | 8/1996 | Hashimoto |
| 5,566,168 A | 10/1996 | Dent |
| 5,570,355 A | 10/1996 | Dail et al. |
| 5,577,024 A | 11/1996 | Malkamaki et al. |
| 5,586,121 A | 12/1996 | Moura et al. |
| 5,612,703 A | 3/1997 | Mallinckrodt |
| 5,613,195 A | 3/1997 | Ooi |
| 5,615,212 A | 3/1997 | Ruszczyk et al. |
| 5,627,829 A | 5/1997 | Gleeson et al. |
| 5,638,361 A | 6/1997 | Ohlson et al. |
| 5,642,354 A | 6/1997 | Spear |
| 5,644,576 A | 7/1997 | Bauchot et al. |
| 5,651,009 A | 7/1997 | Perreault et al. |
| 5,652,892 A | 7/1997 | Ugajin |
| 5,673,322 A | 9/1997 | Pepe et al. |
| 5,677,909 A | 10/1997 | Heide |
| 5,678,208 A | 10/1997 | Kowalewski et al. |
| 5,696,903 A | 12/1997 | Mahany |
| 5,704,038 A | 12/1997 | Mueller et al. |
| 5,706,278 A | 1/1998 | Robillard et al. |
| 5,732,328 A | 3/1998 | Mitra et al. |
| 5,734,833 A | 3/1998 | Chiu et al. |
| 5,758,088 A | 5/1998 | Bezaire et al. |
| 5,768,254 A | 6/1998 | Papadopoulos et al. |
| 5,790,533 A | 8/1998 | Burke et al. |
| 5,790,535 A | 8/1998 | Kou |
| 5,790,551 A | 8/1998 | Chan |
| 5,790,939 A | 8/1998 | Malcolm et al. |
| 5,790,940 A | 8/1998 | Laborde et al. |
| 5,796,726 A | 8/1998 | Hassan et al. |
| 5,802,061 A | 9/1998 | Agarwal |
| 5,809,093 A | 9/1998 | Cooper |
| 5,809,400 A | 9/1998 | Abramsky et al. |
| 5,809,414 A | 9/1998 | Coverdale et al. |
| 5,815,652 A | 9/1998 | Ote et al. |
| 5,815,798 A | 9/1998 | Bhagalia et al. |
| 5,818,831 A | 10/1998 | Otonari |
| 5,818,845 A | 10/1998 | Moura et al. |
| 5,818,887 A | 10/1998 | Sexton et al. |
| 5,822,311 A | 10/1998 | Hassan et al. |
| 5,828,655 A | 10/1998 | Moura et al. |
| 5,848,064 A | 12/1998 | Cowan |
| 5,859,852 A | 1/1999 | Moura et al. |
| 5,862,452 A | 1/1999 | Cudak et al. |
| 5,872,820 A | 2/1999 | Upadrasta |
| 5,889,766 A | 3/1999 | Ohnishi et al. |
| 5,905,719 A | 5/1999 | Arnold et al. |
| 5,909,447 A | 6/1999 | Cox et al. |
| 5,910,945 A | 6/1999 | Garrison et al. |
| 5,915,207 A | 6/1999 | Dao et al. |
| 5,926,458 A | 7/1999 | Yin |
| 5,946,602 A | 8/1999 | Sayegh |
| 5,958,018 A | 9/1999 | Eng et al. |
| 5,959,982 A | 9/1999 | Federkins et al. |
| 5,960,001 A | 9/1999 | Shaffer et al. |
| 5,963,557 A | 10/1999 | Eng |
| 5,966,412 A | 10/1999 | Ramaswamy |
| 5,966,636 A | 10/1999 | Corrigan et al. |
| 6,473,858 B1 * | 10/2002 | Shimomura et al. ........ 713/150 |

FOREIGN PATENT DOCUMENTS

| | | |
|---|---|---|
| EP | 0 920 226 A2 | 6/1999 |
| EP | 0 923 266 A2 | 6/1999 |
| WO | 95/34153 | 12/1995 |
| WO | 96/05690 | 2/1996 |
| WO | 96/11535 | 4/1996 |
| WO | 97/11566 | 3/1997 |
| WO | 97/37457 | 10/1997 |
| WO | 97/38502 | 10/1997 |
| WO | 97/47158 | 12/1997 |
| WO | 97/50249 | 12/1997 |
| WO | 98/12829 | 3/1998 |
| WO | 98/12833 | 3/1998 |
| WO | 98/16046 | 4/1998 |
| WO | WO 98/16046 | 4/1998 |
| WO | 98/19466 | 5/1998 |
| WO | 98/20724 | 5/1998 |
| WO | 98/23112 | 5/1998 |
| WO | 98/24250 | 6/1998 |
| WO | 98/37669 | 8/1998 |
| WO | 98/37706 | 8/1998 |
| WO | 98/44747 | 10/1998 |
| WO | 98/47236 | 10/1998 |
| WO | 98/49625 | 11/1998 |
| WO | 98/54858 | 12/1998 |
| WO | 98/54859 | 12/1998 |
| WO | 99/04338 | 1/1999 |
| WO | 99/04508 | 1/1999 |
| WO | 99/04509 | 1/1999 |
| WO | 99/04521 | 1/1999 |
| WO | 99/05828 | 2/1999 |
| WO | WO 99/09707 | 2/1999 |
| WO | 99/13616 | 3/1999 |
| WO | 99/14963 | 3/1999 |
| WO | 99/16201 | 4/1999 |
| WO | 99/19996 | 4/1999 |
| WO | 99/19999 | 4/1999 |
| WO | WO 99/20022 | 4/1999 |
| WO | 99/21287 | 4/1999 |
| WO | 99/21291 | 4/1999 |
| WO | 99/21296 | 4/1999 |
| WO | 99/21328 | 4/1999 |
| WO | 99/21329 | 4/1999 |
| WO | 99/21378 | 4/1999 |
| WO | 99/21381 | 4/1999 |
| WO | 99/22500 | 6/1999 |
| WO | 99/39480 | 8/1999 |

* cited by examiner

TRANSMISSION AND RECEPTION OF TCP/IP DATA OVER A WIRELESS COMMUNICATION CHANNEL

RELATED APPLICATIONS

This is a continuation-in-part application of an application entitled TRANSMISSION OF TCP/IP DATA OVER A WIRELESS COMMUNICATION CHANNEL, Ser. No. 09/407,1646, filed Sep. 28, 1999 now abandoned, which claims priority to a provisional application entitled SYSTEM AND METHOD FOR WIRELESS INTERNET SERVICE, Serial No. 60/151,282, filed Aug. 27, 1999, each of which is hereby incorporated by reference.

FIELD OF THE INVENTION

The invention relates generally to transmission of Internet data over a wireless communication channel. More particularly, this invention relates to transmission of Internet data using digital video broadcast format over a satellite communication channel.

BACKGROUND OF THE INVENTION

Explosive growth of the Internet, including Internet related commerce, has greatly increased the demand for Internet access. This demand crosses all geographic and demographic boundaries, from developed urban neighbors and cities to remote and developing nations. Presently access to the Internet is typically through copper wire. In developed nations such infrastructure exists in the form of public telephone networks. However, in developing countries and remote locations, there may not be a copper wire infrastructure in place, and development of such an infrastructure may be excessively costly, making its development unpractical. In addition, as Internet use increases, access through existing copper wires may become unacceptably slow due to the limited bandwidth of the copper wire and increased volume of Internet traffic. Because of these and other limitations on the existing infrastructure, a high-speed, reliable Internet communication service over a satellite link is desirable. A satellite link can provide Internet access to developing countries, as well as remote locations, where there is no copper wire infrastructure in place. Moreover, Internet access over a satellite link can provide an attractive alternative to copper wire, even if the infrastructure is in place, by providing high-speed, more reliable Internet access.

The Internet is based on an architecture developed by the Defense Advanced Research Projects Agency (DARPA). This architecture is generally referred to as the transmission control protocol/Internet protocol (TCP/IP) suite. The TCP/IP protocol suite is organized into four layers; network access layer; Internet layer; TCP layer; and process layer.

FIG. 1 is a block diagram illustrating an exemplifying system for discussion of the TCP/IP model. FIG. 1 shows two nodes 20 and 22 connected to the Internet 24. As illustrated, the Internet comprises multiple subnetworks 26 and 28. Data is transferred between subnetworks through a router 30. In a node, network access layer 32 provides access to the subnetwork to which the node is connected. At the network access layer, a network header 34 is added to the data to be sent over the subnetwork.

Various standards have been developed for transmission of data across subnetworks, also referred to as Local Area Networks (LAN). These standards have been collected into the Institute of Electrical and Electronic Engineers (IEEE) 802 specification. Within this specification, the IEEE 802.3 defines a LAN utilizing a carrier sense multiple access collision detection (CSMA/CD) protocol. In CSMA/CD protocol when a node on the network wants to transmit data, it senses the communication channel to determine if the channel is being used. If the channel is in use, the node does not transmit and waits for a time when no traffic is sensed to transmit. The transmitting node also monitors the channel as it transmits to determine if another node transmits at the same time. If two nodes transmit at the same time, there is a collision, which both nodes detect. Following detection of a collision, both transmitting nodes will discontinue transmission. The nodes will then wait independently random periods of time and then attempt to retransmit. A popular implementation of the CSMA/CD protocol is the Ethernet.

If data is to be transmitted between two nodes which are located on different, interconnected, subnetworks the Internet Protocol (IP) is used. At the IP layer 36, functions for routing across multiple networks are provided. The IP layer provides an IP header 38 which comprises the destination address. To facilitate movement of data between two subnetworks, the router 30 is used. The router 30 receives a message from one subnetwork and examines the IP header 38 for the destination address. Knowing the destination address, the router transmits the message to the appropriate subnetwork where the destination node is located.

The Transmission Control Protocol (TCP) layer 40 provides for a reliable, error free, data exchange. The TCP layer 40 receives a data block 42 from the process layer 44. If the data block 42 is too large, the TCP layer 40 divides the data block 44 into messages 46. A TCP header 48 is added to each message 46. The TCP header comprises a destination port, sequence number and checksum. The destination port identifies which port at the destination node is to receive the message 46 transmitted. The sequence number identifies the individual data packets so the messages 46 can be sequenced in the proper order at the destination node. The checksum provides a method of verifying the integrity of the data received at the destination node.

The process layer 44 contains the logic needed to support various user applications. Applications which operate on top of the TCP/IP include, for example, Simple Mail Transfer Protocol (SMTP) for basic electronic mail, File Transfer Protocol (FTP) for file transfer from one system to another, hyper text transfer protocol ("HTTP") for transfer of Web pages and TELNET which provides remote login capability.

At the destination node, the process described above is performed in reverse. Traffic on the subnetwork is received by the network access layer 32. The network header 34 is removed and the remaining data passed to the IP layer 36. At the IP layer, the IP header 38 is removed and examined. If the message is addressed to the destination node, the remaining data is passed to the TCP layer 40, otherwise the message is ignored. The TCP layer removes the TCP header 48. The integrity of the message 46 is then verified using the checksum from the TCP header 48. If the data block that was sent has been divided into multiple data packets, the TCP layer 40, using the sequence number from the TCP header 48, places the messages 46 in proper order. After the TCP layer 40 has rebuilt the data block 42 that was transmitted, it passes the data block 42 to the appropriate port at the process layer 44.

While the TCP/IP and Ethernet protocols are used for transmission of data on networks such as the Internet, Digital Video Broadcast (DVB) is used to send Motion Picture Expert Group (MPEG) data over a satellite link. In the TCP/IP model, DVB would be located at the network access layer providing an interface to the physical transmission medium comprising the satellite channel.

The DVB protocol is the result of a market led consortium of public and private sector organizations in the television industry. This consortium led to the development of the DVB standard published by the European Telecommunications Standard Institute (ETSI). The DVB standard describes the modulation and channel coding system for satellite digital television broadcast. This standard is compatible with the MPEG-2 coded TV services. The MPEG-2 protocol generates digital information separated into "data pockets." DVB simply receives the data pockets and places them into "data containers" for transmission over a wireless media. Within the DVB protocol, no restriction exists as to the kind of information which can be stored in these data containers.

As digital TV continues to gain acceptance and becomes common place, the demand for DVB receivers will greatly increase. Once DVB receivers come to the market in large numbers, it is expected that the commonality of design for a large market will enable costs to be kept down.

Thus, DVB can provide a cost effective means of video data transmission via satellite. However, no analogous standard, or cost effective way, has been developed to transmit TCP/IP data via satellite.

Therefore, there is a need in the technology for a means for and method of transmitting TCP/IP data over a satellite link.

SUMMARY OF THE INVENTION

Demand for high-speed, reliable Internet access is increasing. This increased demand is occurring where there is no "copper wire" infrastructure in place, such as developing nations and remote areas. In addition, where the "copper wire" infrastructure is in place, its capacity is often exceeded by the demand placed upon the system. The invention provides a communication system for transmission of Internet or other TCP/IP data over a satellite link.

One embodiment provides Internet service to a plurality of remote units in communication with a satellite. The satellite is also in communication with a hub station. The hub station is further in communication with a plurality of content servers. Data from the content servers is communicated to the hub station via the Internet. The hub station then transmits the content server data received from the Internet to the plurality of remote units over the satellite link. The hub station formats the data, to be transmitted over the satellite link, in a format compatible with the DVB standard.

Further, a hub station receiving a block of Internet data for transmission to a plurality of remote units over a satellite communication channel formats the data within DVB frames such that fragment headers occur at variable locations within the DVB frame. A value, stored within the DVB frame, indicates the location of the fragment headers within the DVB frame.

DETAILED DESCRIPTION OF THE INVENTION

Figure 1:
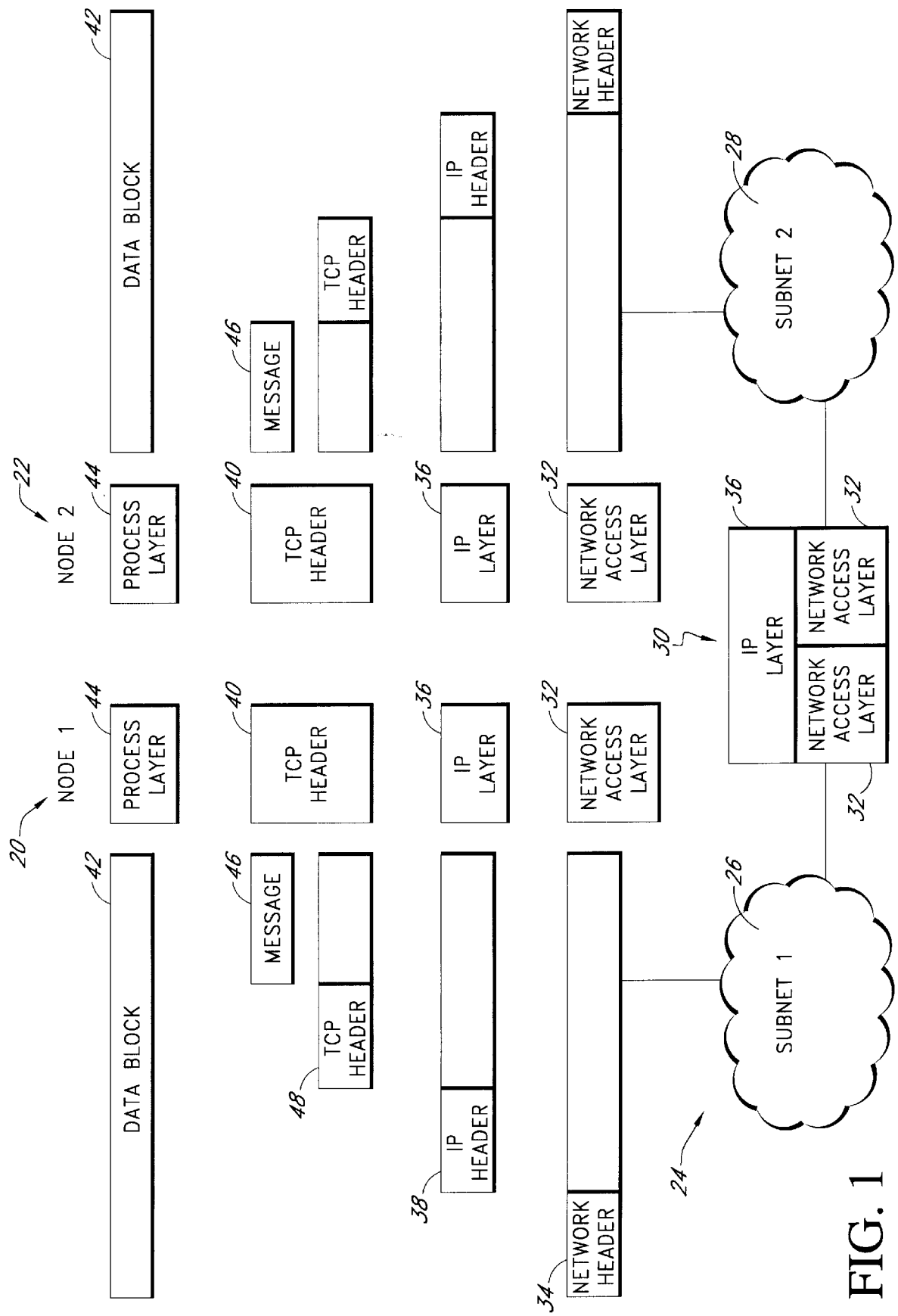
FIG. 1 is an block diagram illustrating an exemplifying system for discussion of the TCP/IP model
Figure 2:
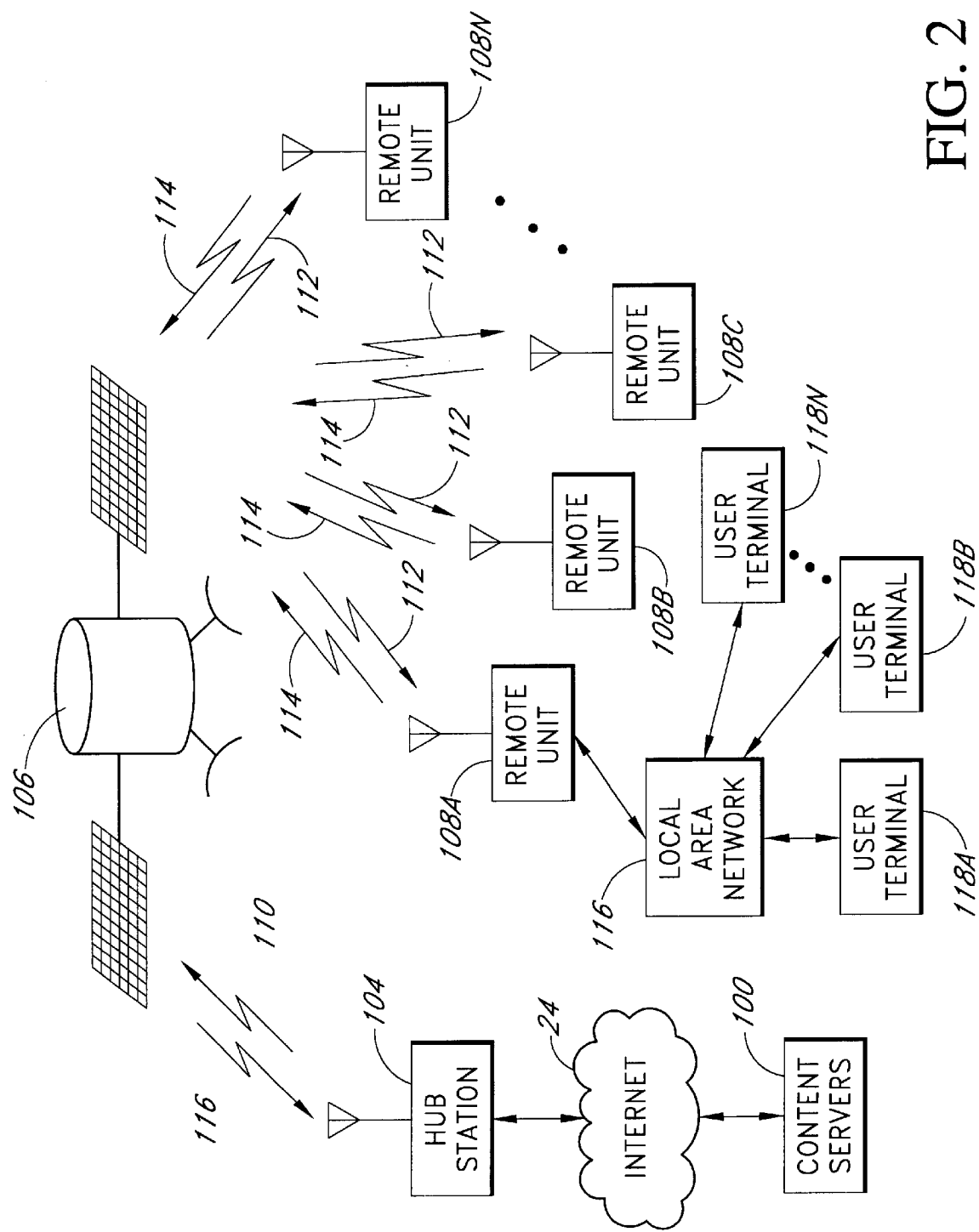
FIG. 2 is a block diagram illustrating an exemplifying system in which the invention may be embodied.

FIG. 2 is a block diagram illustrating an exemplifying system in which the invention may be embodied. The system in FIG. 2 provides high-speed, reliable Internet communication service over a satellite link.

In particular, in FIG. 2, content servers 100 are coupled to the Internet 24 which is in turn coupled to a hub station 104 such that the hub station 104 can request and receive digital data from the content servers 100. The hub station 104 also communicates via satellite 106 with a plurality of remote units 108A–108N. For example, the hub station 104 transmits signals over a forward uplink 110 to the satellite 106. The satellite 106 receives the signals from the forward uplink 110 and re-transmits them on a forward downlink 112. Together, the forward uplink 110 and the forward downlink 112 are referred to as the forward link. The remote units 108A–108N monitor one or more channels which comprise the forward link in order to receive remote-unit-specific and broadcast messages from the hub station 104.

In a similar manner, the remote units 108A–108N transmit signals over a reverse uplink 114 to the satellite 106. The satellite 106 receives the signals from the reverse uplink 114 and re-transmits them on a reverse downlink 116. Together, the reverse uplink 114 and the reverse downlink 116 are referred to as the reverse link. The hub station 104 monitors one or more channels which comprise the reverse link in order to extract messages from the remote units 108A–108N. For example, in one embodiment of the exemplifying system, the reverse link carries multiple access channels in accordance with assignee's co-pending application entitled METHOD AND APPARATUS FOR MULTIPLE ACCESS IN A COMMUNICATION SYSTEM, application Ser. No. 09/407,639, filed Sep. 28, 1999, the entirety of which is hereby incorporated by reference.

In one embodiment of the exemplifying system, each remote unit 108A–108N is coupled to a plurality of system users. For example, in FIG. 2, the remote unit 108A is shown as coupled to a local area network 116 which in turn is coupled to a group of user terminals 118A–118N. The user terminals 118A–118N may be one of many types of local area network nodes such as a personal or network computer, a printer, digital meter reading equipment or the like. When a message is received over the forward link intended for one of the user terminals 118A–118N, the remote unit 108A forwards it to the appropriate user terminal 118 over the local area network 116. Likewise, the user terminals 118A–118N can transmit messages to the remote unit 108A over the local area network 116.

In one embodiment of the exemplifying system, the remote units 108A–108N provide access to the Internet for a plurality of users. For example, assume that the user terminal 118A is a personal computer which executes browser software in order to access the World Wide Web. When the browser receives a request for a web page or embedded object from the user, the user terminal 118A creates a request message according to well-known techniques. The user terminal 118A forwards the request message over the local area network 116 to the remote unit 108A, also using well-known techniques. Based upon the request message, the remote unit 108A creates and transmits a wireless link request over a channel within the reverse uplink 114 and the reverse downlink 116. The hub station 104 receives the wireless link request over the reverse link. Based upon the wireless link request, the hub station 104 passes a request message to the appropriate content server 100 over the Internet 24.

In response, the content server 100 forwards the requested page or object to the hub station 104 over the Internet 24. The hub station 104 receives the requested page or object and creates a wireless link response. The hub station transmits the wireless link response over a channel within the forward uplink 110 and forward downlink 112. For example, in one embodiment of the exemplifying system, the hub station 104 operates in accordance with assignee's co-pending application entitled METHOD AND SYSTEM FOR FREQUENCY SPECTRUM RESOURCE ALLOCATION, application Ser. No. 09/407,645, filed Sep. 28, 1999, the entirety of which is hereby incorporated by reference.

The remote unit 108A receives the wireless link response and forwards a corresponding response message to the user terminal 118A over the local area network 116. In one embodiment of the exemplifying system, the process of retrieving a web page or object is executed in accordance with assignee's co-pending application entitled DISTRIBUTED SYSTEM AND METHOD FOR PREFETCHING OBJECTS, application Ser. No. 09/129,142, filed Aug. 5, 1998, the entirety of which is hereby incorporated by reference. In this way, a bi-directional link between the user terminal 118A and the content servers 100 is established.

Figure 3:
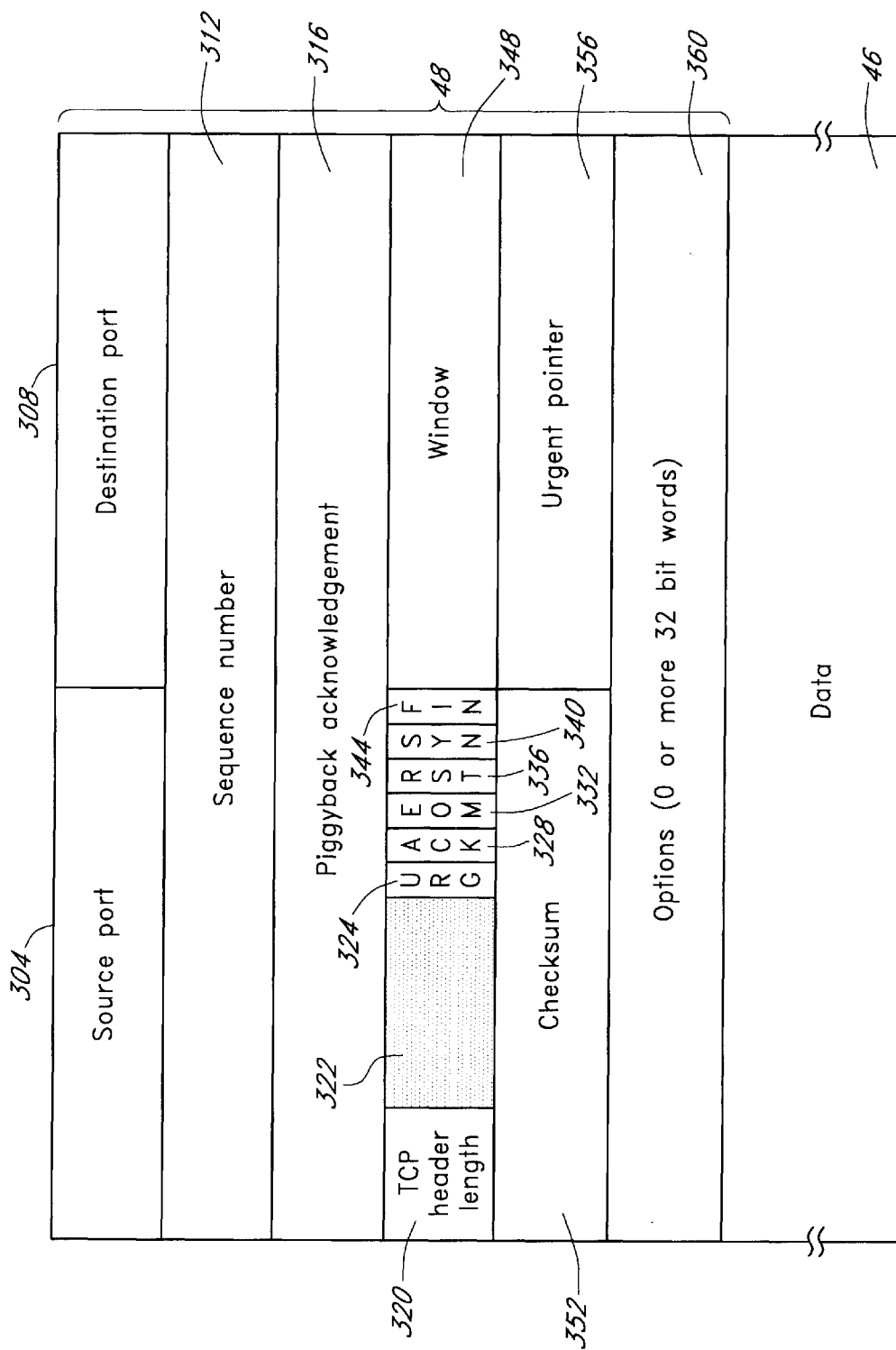
FIG. 3 is a diagram describing the structure of a TCP transport packet of a transport layer.

To better understand the operation and advantages of the invention, descriptions of example packet structures are provided. FIG. 3 is a diagram describing the structure of a TCP packet 300. The term "packet" commonly refers to a unit of databits, including data and control signals. The term "message" commonly refers to the user information or data being communicated. A message may be of any length. If necessary, the TCP layer fragments or splits the message into multiple packets for transmission.

As shown in FIG. 3, the TCP header 48 comprises a source port field 304 followed by a destination port field 308, each having 16 bits, to identify the end points of a network connection. Each "host" computer may determine for itself how to allocate its ports. In a network, the term "host" commonly refers to one of a group of computers intended for running user applications (i.e., programs). The TCP header 48 further includes a sequence number field 312. TCP accepts arbitrarily long messages from user applications, breaks them up into TCP datagrams not exceeding 65,536 bytes, and sends each datagram as a separate packet. Hence, the sequence number 312 is a 32-bit word indicating the location of the datagram in the original message.

Next, a piggyback acknowledgment field 316 is used by a receiving computer to indicate receipt of a particular packet on a parallel reverse connection. A TCP header length field 320 of 4 bits follows the piggyback acknowledgment field 316 to indicate how many 32-bit words are contained in the TCP header 48. This information is needed because the header 48 includes a variable-length options field 360 which communicates data as may be agreed upon by the source host and destination host.

After several unused bits 322, the TCP header length 320 is followed by six 1-bit flags. The first 1-bit flag is URG 324 which is set to 1 if an urgent pointer 356 is used, and set to 0 otherwise. The urgent pointer 356 is used to indicate a byte offset from the current sequence number 312 at which urgent data are to be found. The second 1-bit flag is ACK 328 which is set to 1 when a packet bears an acknowledgment, and set to 0 otherwise. For instance, a connection reply bears an acknowledgment, so its ACK bit 328 is set to 1. The third 1-bit flag is EOM 332 indicating the end of message when set to 1. The last packet of a message has the EOM bit 332 set to 1. All other packets will have the EOM bit 332 set to 0. The fourth 1-bit flag is RST 336 which is used to reset a connection that has become confused due to a host delay or breakdown. A host delay may occur due to congestion of packets over the network. A host breakdown (commonly referred to as a "crash") may be caused by a variety of events, such as a power failure, a host processor reset, or an error in the host application software. The fifth 1-bit flag is SYN 340 which is used to establish synchronization for a connection request. A connection request has the SYN bit 340 set to 1 and ACK bit 328 set to 0 to indicate that the piggyback acknowledgment 316 is not in use. As noted above, the connection reply does bear an acknowledgment with its SYN bit 340 and ACK bit 128 set to 1. The sixth 1-bit flag is FIN 344 which indicates release of a connection. The FIN bit 344 is set to 1 to indicate that the sender has no more data, and set to 0 otherwise.

Flow control in TCP is handled using a variable-size sliding window. A 16-bit window field 348 is used to indicate how many bytes a source host may send beyond the number of bytes acknowledged by a destination host on a parallel reverse connection. The window field 348 is followed by a checksum field 352 to provide reliable connections. An error in transmission can be detected by the destination host by computing the checksum in the same way as the source host and comparing it against the value in the checksum field 352. The value in the checksum field 352 is calculated by the source host by adding up all the data, regarded as 16-bit words, and then converting the resulting sum to its 1's complement, a standard computer operation.

The checksum field 352 is followed by the above-described urgent pointer field 356. An options field 360 follows the urgent pointer field 356 to communicate optional data, such as buffer sizes during the link setup procedure. The options field 360 is followed by a data field 46. The data field 370 comprises the message being communicated over the computer network. For instance, the message could be a word processing document, a computer program, a digital image, digitized voice information for a phone call, an electronic mail message and so forth.

Figure 4:
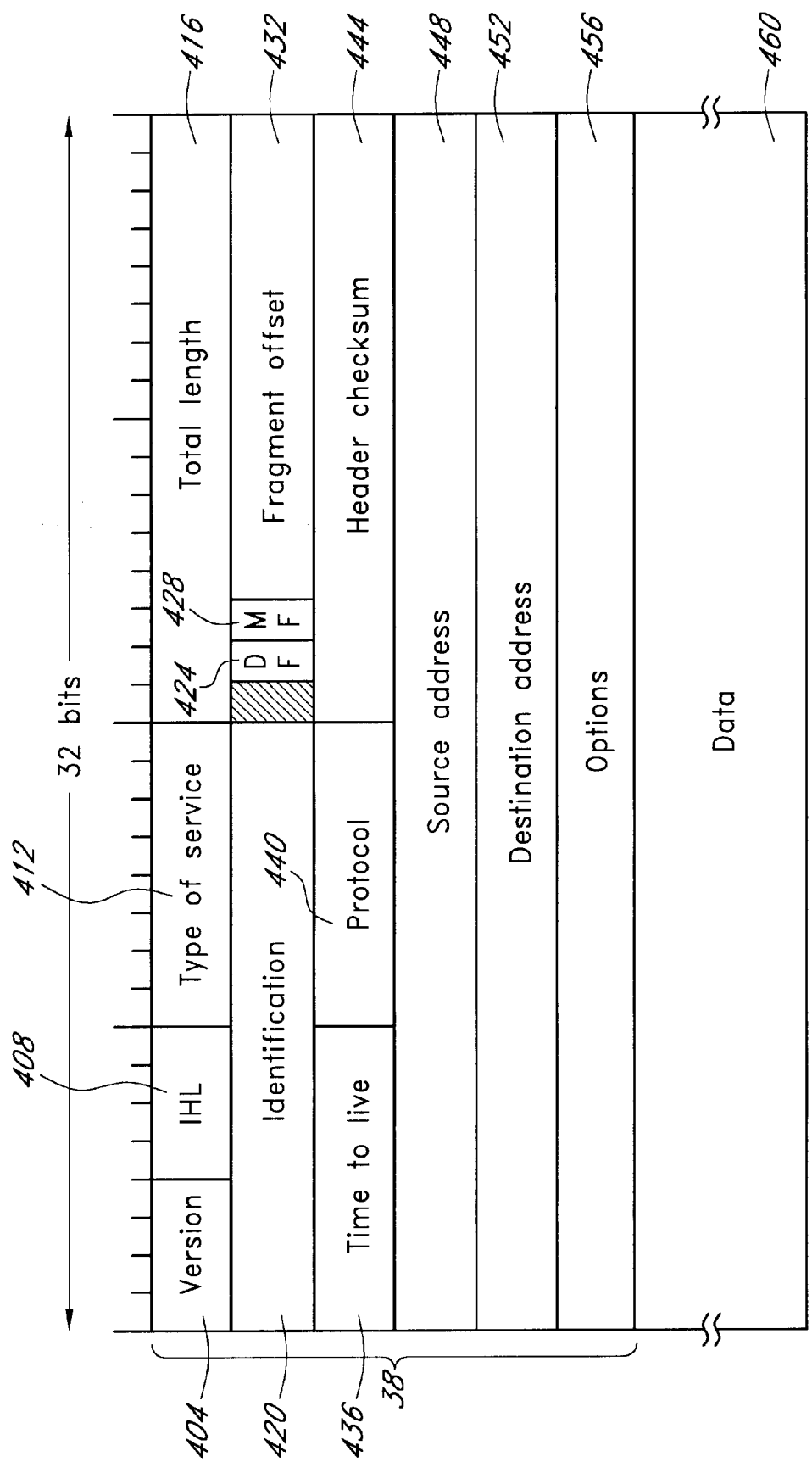
FIG. 4 is a diagram describing the structure of an IP packet of a network layer.

FIG. 4 is a diagram describing the structure of an IP packet or datagram. An IP datagram comprises an IP header 38 followed by a data field 460. The IP header 38 includes a 20-byte fixed part and a variable length optional part. The 20-byte fixed part of the IP header 38 includes a version field 404 which indicates to which version of the Internet protocol the datagram belongs. By including the version 404 in each datagram, it is possible to change protocols while the network is operating. Since the IP header 38 is not constant in length, an IP header length (IHL) field 408 is provided to indicate the length of the IP header 38 in 32-bit words. By definition of the IP, the minimum value of the IHL 408 is 5. The IHL field 408 is followed by a "type of service" field 412 which allows the host computer to inform the subnetwork the kind of service required. Various combinations of reliability and speed are possible by predefined service types. The "type of service" field 412 is followed by a "total length" field 416 which includes the total number of all bits in the datagram, i.e., both header and data bits. The maximum size of the "total length" field 416 is 65,536 bytes.

The IP layer may break up each TCP datagram into smaller fragments for transmission across the network. The elementary fragment unit is 8 bytes. Since the size of a datagram is a maximum of 65,536 bytes, there is a maximum of 8192 fragments per datagram. Hence, after the "total length" field 416, an identification field 420 is used to allow the destination host computer to determine to which datagram a newly arriving fragment belongs. All fragments belonging to the same datagram contain the same value in the identification field 420.

After an unused bit, two 1-bit fields follow the identification field 420. The first 1-bit field is a "don't fragment" ("DF") bit 424. When the DF bit 424 is set to 1, network gateways are instructed not to fragment the datagram because the destination is incapable of reconstructing the fragments together into their original datagram. The second 1-bit field is a "more fragments" ("MF") bit 428. The MF bit 428 is used as a double check against the total length field 416 to ensure that no fragments are missing from the reconstructed datagram. Except for the last fragment, all message fragments have the MF bit 428 set to 1.

The two 1-bit fields are followed by a "fragment offset" field 432 which indicates the location or order of the current fragment in the datagram. As shown in FIG. 4, the "fragment offset" field 432 consists of 13 bits and, hence, there is a maximum of 8192 possible message fragments for each datagram. The "fragment offset" field 232 is followed by a "time to live" field 436 which is a counter used to limit packet lifetimes. Typically, a network gateway destroys packets having a lifetime exceeding 255 seconds.

After the IP layer at the destination host constructs a complete datagram, the IP network layer utilizes a protocol field 440 to indicate a typical transport protocol. TCP is one transport protocol, but other protocols such as transport protocols specified by the Open Systems Interconnection (OSI) standard (e.g., ISO 8073) may be used. A header checksum field 444 follows the protocol field 440 to verify the validity of the IP header 400. The header checksum 444 is useful because the IP header 38 may change at a gateway, e.g., due to fragmentation into multiple fragments. A "source address" field 448 follows the header checksum 444 to indicate the source network number and host number of the data portion of the datagram. A destination address field 452 follows the source address field 444 to indicate the destination network number and host number of the data portion. Finally, an options field 456 follows the destination address field 452.

Figure 5:
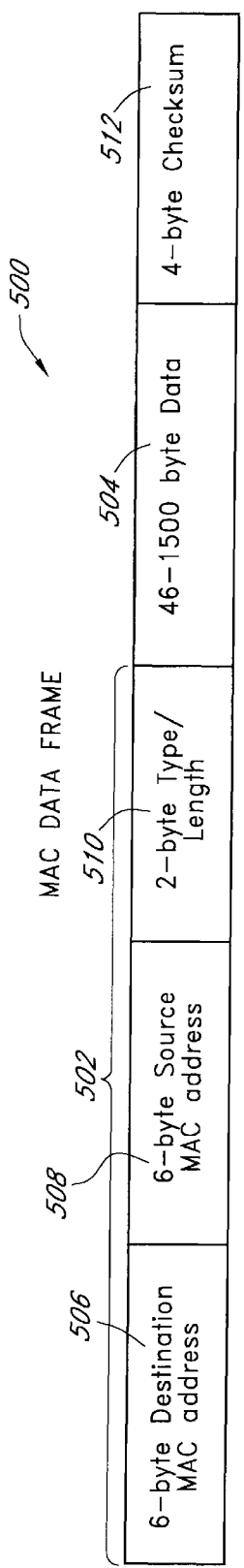
FIG. 5 is a diagram describing the structure of an exemplifying Media Access Control (MAC) data frame at the network access layer.

FIG. 5 is a diagram describing the structure of a network header at the network access layer. The network header and data comprise a media access control (MAC) data frame 500, typical of an Ethernet data frame. The IP datagram from the IP layer is encapsulated into the MAC data frame. The MAC data frame 500 comprises a header 502 and data 504, and checksum 512.

The header 502 comprises a 6-byte destination address 506 identifying the desired designation of the datagram. A 6-byte source address 508 identifying the originator of the datagram follows the destination address 506. The source address 508 is followed by a 2-byte type field 510 identifying the type of data frame, such as for example Ethernet. The "type" field 510 is followed by a variable length data field 504. The data field 504 can be from 46 to 1500 bytes in length depending on the size of the IP datagram. If the IP datagram requires more than 1500 bytes of data field 504, the datagram is packetized into multiple MAC frames. The data field 504 is followed by a 4-byte checksum 512. The value in the checksum field 512 is calculated by the source host by adding all the data, regarded as 16 bit words, and then converting the resulting sum to 1's complement, a standard computer operation.

Figure 6:
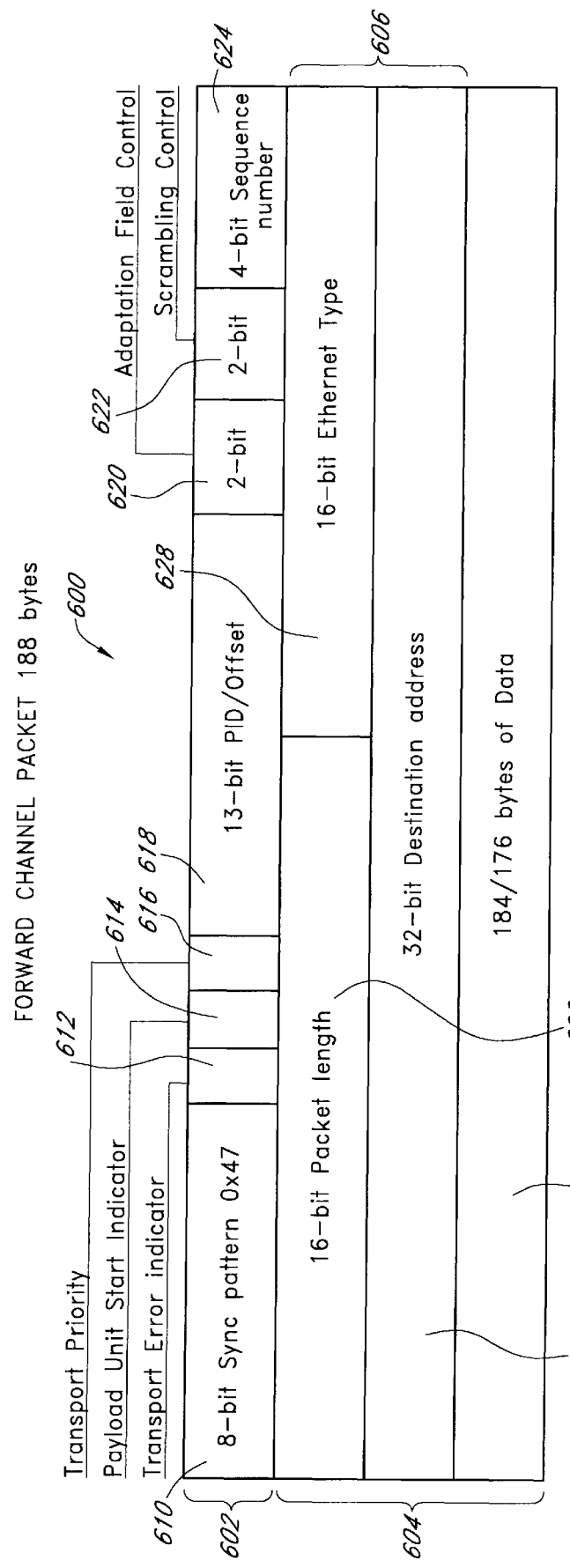
FIG. 6 is a block diagram describing the structure of a Digital Video Broadcast (DVB) header of a DVB data frame.

FIG. 6 is a block diagram describing the structure of a DVB frame 600. A standard DVB frame comprises a DVB header 602 and a data container 604. The DVB header 602 begins with an 8 bit sync pattern 610. Following the sync pattern field 610 are three single bit fields, the transport error indicator 612, the payload unit start indicator bit 614 and the transport priority bit 616.

Following the transport priority bit 616 is the 13-bit PID/Offset (PID) 618. In a standard DVB header the PID is used to indicate the video channel the date corresponds to. Following the PID field 618 are a 2-bit adaptation field control 620, a 2-bit scrambling control 622 and a 4-bit sequence number 624.

Next, the DVB frame comprises a data container 604. The data container provides 184 bytes of storage for data to be transmitted.

In one embodiment, the system comprises a hub station in communication with the Internet. The hub station receives data from the Internet and formats the data for transmission over a satellite communication link to a plurality of remote units. At the remote units the data is converted back to its original Internet data format and transmitted by the remote unit to end users. In other embodiments the remote unit may be, for example, hand held and use the internet data locally at the remote unit.

TCP/IP data, if formatted appropriately, may be able to be transmitted over a satellite link using DVB. Because DVB provides a standardized method of transmitting video data over a satellite link, costs of implementing a DVB satellite link should decrease as digital TV evolves. Thus, DVB can be an attractive data transfer platform.

In one embodiment, the TCP/IP frames are formatted into DVB frames so as to align the beginning of each TCP/IP data frame with the beginning of a DVB data frame and filling the DVB frame, or multiple DVB frames, until all the TCP/IP data is transmitted. This embodiment is attractive because synchronization of TCP/IP and DVB frames is simple, because the beginning of a TCP/IP frame always occurs at the beginning of a DVB frame. The size of a TCP/IP data frame is, on average, a different size than a DVB frame. If the TCP/IP data spans multiple DVB frames, not all of the DVB data frames will be filled. This results in non-optimal utilization of the DVB data frames, usually resulting in a portion of a DVB frame being empty. In the typical case, when the TCP/IP data does not fit exactly into a DVB frame, the unused portion of the DVB frame is wasted, decreasing the overall bandwidth of the communication system.

According to another, embodiment of the invention, the DVB header 602 fields and data container 604 are assigned values as described below. The DVB header 602 fields, which are included at the start of every DVB frame 600, remain the same as in a standard DVB header except for the PID field 618. In this embodiment of the invention, the PID field 618 is assigned a value indicating the location in the data container 604 where a new MAC frame begins. The values assigned to the PID are described in detail below. Use of the PID field to indicate the location where a new MAC frame begins within a DVB frame allows TCP/IP data to fill the DVB frames rather than to regularly transmit partially filled frames. In other embodiments, DVB header 602 fields other than the PID field 618 may be assigned a value indicating the location in the data container 604 where a.new MAC frame begins One advantage of using the PID field 618 to carry a value indicating the location in the data container 604 of the MAC frame is that standard off-the-shelf DVB receivers can be used to receive the DVB data stream. A standard DVB receiver is capable of providing data output when seemingly random, or disrupted, values are detected in the PID field 618. In addition, the PID field 618 contains enough data bits to carry information indicating the location of the MAC frame anywhere within the DVB frame. Other DVB header fields may not contain a sufficient number of bits to carry the information.

If one attempts to place information indicating location of the MAC frame into DVB header fields other than the PID fields 618, off-the-shelf DVB receivers may detect errors. The detected errors can be catastrophic, causing the DVB receiver to provide no output except perhaps an indication that an error has occurred. In such a case, the DVB data is not output by the receiver and the system becomes inoperable. It may be possible to use DVB header 602 fields other than the PID filed 618 to contain the location value with this same advantage as long as the field does not interfere with the operation of a standard DVB receiver.

The DVB data container 604 comprises two portions according to the invention: a first fragment header 606 and a data packet 608. The first fragment header 606 is transmitted at the beginning of the first fragment of a multiple fragment MAC data frame transmission. As will be discussed below, one MAC data frame may be packetized into multiple DVB data frames to improve the efficiency of transmitting the MAC data frame in a DVB data frame format. Because the header information only needs to be transmitted once, it is transmitted with the first fragment only. On subsequent data frames, the header information is not repeated.

The first fragment header 606 comprises a 16-bit packet length field 626. The value placed in the packet length field 626 corresponds to the length of the data field 504 of the MAC data frame. Following the packet length field 626, a 16-bit "type" field 628 contains the value from the 2-byte type field 510 of the MAC data frame. A destination address field 630 follows after the "type" field 628 and contains 4 bytes of the 6 byte destination address 502 of the MAC data frame. The 4 bytes used may be either the 4 most significant bytes, the 4 least significant bytes or any other combination of 4 bytes from the 6 byte MAC destination address 502 field. In the invention it is not anticipated that there will be more than 4 bytes of address space needed to identify all the remote units 108A–108N of the system. If growth in the number of remote units 108A–108N exhausts the 4 byte address space, other fields in the DVB header 602, not required to support operation of a standard DVB receiver, may be allocated to remote unit 108A–108N addressing.

The remainder of the DVB data container is the data packet 608. The total length of a DVB data container is 188 bytes. Because there is a 4 byte DVB header 602 transmitted in every DVB data frame 600, there is a maximum of 184 bytes available to carry other information. All of the 184 bytes may comprise the data packet 608 if there is no first fragment header 606 required in the DVB data frame 600. If the DVB data frame 600 contains a first fragment of a MAC data frame, 8 bytes are allocated for the first fragment header 606 and 176 bytes are available for the data packet 608.

Figure 7:
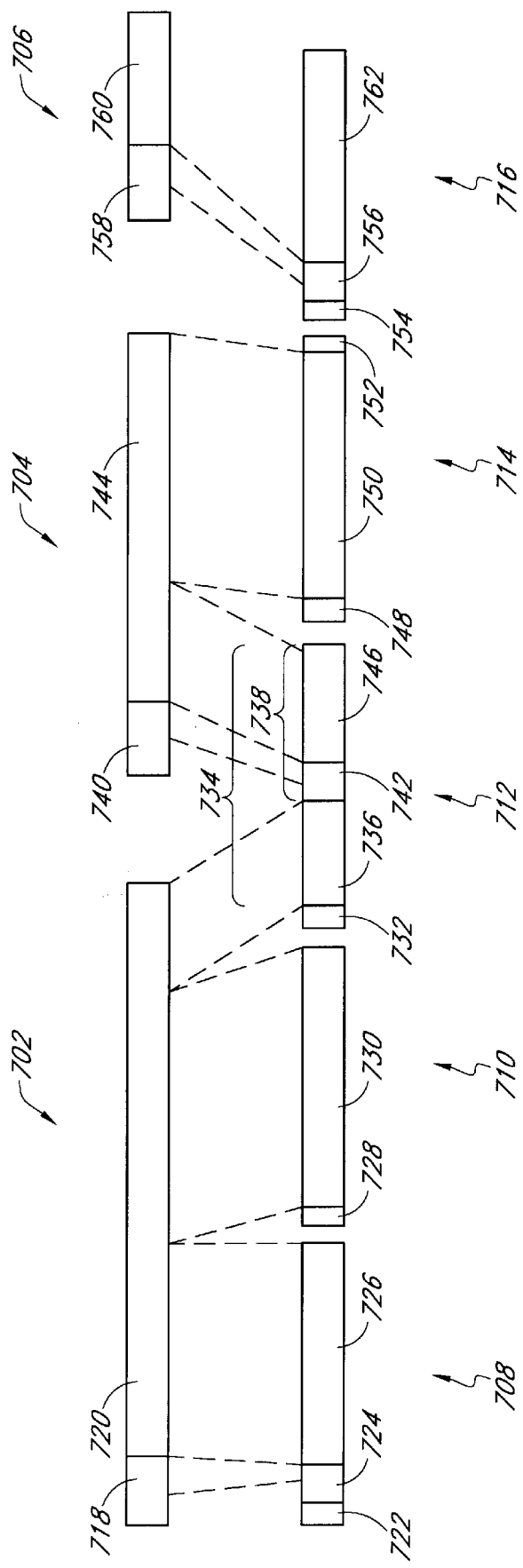
FIG. 7 is a block diagram illustrating conversion of a MAC data frame into a DVB data frame.

To better understand the operation of the invention, a description of an example set of MAC data frames packetized into DVB data frames is provided. FIG. 7 illustrates three example MAC data frames 702, 704 and 706. Packetizing three MAC data frames 702, 704 and 706 into five DVB data frames 708, 710, 712, 714 and 716 is described.

MAC data frame 702 comprises a header section 718 and a data section 720 corresponding to 502 and 504 of FIG. 5 respectively. DVB data frame 708 comprises a DVB header 722, a first fragment header 724 and a data packet 726, corresponding to 602, 606 and 608 of FIG. 6, respectively.

The first portion of the DVB data frame 708 is the DVB header 722. The DVB header is at the beginning of every DVB data frame to conform to the DVB specification. Because this is the beginning of a MAC data frame, the first fragment header 724, as discussed in relation to FIGS. 5 and 6, is built and located after the DVB header 722 in DVB data frame 708. With the DVB header 722, and the first fragment header, there are 176 bytes remaining in DVB data frame 708 for data. In this example, there are more than 176 bytes of data in the MAC data section 720. Therefore the first 176 bytes of data from the MAC data section 720 are carried in DVB data packet 726, filling DVB data frame 708. The additional data in 720 is carried in the next DVB data frame 710.

DVB data frame 710 begins with a DVB header 728. Because this is a continuation of MAC data frame 702, there is no first fragment header. With no first fragment header there are 184 bytes available in the DVB data packet 730 for MAC data. In this example, there are more than 184 bytes of data remaining in the MAC data portion 720 so the entire DVB data packet 730 is filled with data from MAC data frame 702. The additional data remaining in MAC data frame 702 is carried in DVB data frame 712.

DVB data frame 712 begins with a DVB header 732. As described in relation to DVB data frame 710, there is no first fragment header and thus there are 184 bytes of data available for MAC data portion 720. In this example, there are less than 184 bytes of data remaining in MAC data portion 720. Thus the last segment of data portion 720 is located in the first portion 736 of DVB data packet 734.

If the remaining portion 738 of the DVB data packet 734 is at least 8 bytes in length, so as to accommodate an entire first fragment header, information corresponding to the next MAC data frame 704 is also carried in the 712. In this example, the remaining portion 738 of the DVB data frame 712 contains more than 8 bytes. Thus the header 740 of MAC data frame 704 is converted into a DVB first fragment header 742. If there are at least 4 bytes still available in the remaining portion 738 of DVB data packet 734 following the first fragment header 742, MAC data 744 is carried in a section 746 of the remaining data portion 732. In this example, there is enough data in MAC data frame 738 to fill section 746 of DVB data frame 712. The data remaining in MAC data frame 704 is carried in the next DVB data frame 714.

DVB data frame 714 begins with a DVB header 748. Because frame 714 is not the first fragment of MAC data frame 704, there is no first fragment header. In this example, the remaining data portion 744 of MAC data frame 702 is carried in the data packet 750 of DVB data frame 714. The remaining portion 752 of DVB data frame 714 does not contain at least 8 bytes. Because there are less than 8 bytes available, the remaining portion 752 of DVB frame 714 cannot carry the entire first fragment header from MAC data frame 706. In one embodiment the first fragment header is not split between two DVB data frames, therefore, the remaining portion 752 of DVB data frame 714 is unused. In other embodiments, the first fragment header may be divided between two DVB data frames.

In the embodiment where the first fragment header is not divided between two DVB data frames, the procedure described advances to the next DVB data frame 716. DVB data frame 716 begins with DVB header 754. The header 754 is followed by a first fragment header 756 which corresponds to the MAC header 758 of MAC data frame 706. Data from MAC data frame 706 is carried in a data packet 762 in the same manner as described above.

In the example discussed in FIG. 7, first fragment headers do not always occur at the start of a DVB data frame. Allowing first fragment headers to occur at a variable location within a DVB data packet, provides for efficient utilization of the DVB data frame. As illustrated in FIG. 7, if first fragment headers could only occur at the beginning of a DVB data frame, large portions of DVB data packets could go unused following the completion of one MAC data frame to the beginning of the next DVB data frame. Placing first fragments at a variable location within the data packet of a DVB data frame provides efficient use of the DVB data frame, however, the receiving system must be able to locate the first fragment header in the data packet.

According to one embodiment of the invention, location of the first fragment header is provided by the PID field 618 in FIG. 6, of the DVB data frame. In other embodiments of the invention, location of the first fragment header may be provided in other DVB header 602 fields which do not adversely affect DVB transmission. In the embodiment utilizing the PID field 618 for indicating location of the first fragment header, as the DVB data frame is being built, if a first fragment header is located within the data packet 608 of the DVB data frame, the value of the PID is set to correspond to the number of bytes into the data packet the beginning of the first fragment header is located. If the first fragment header follows immediately after the DVB header, then the PID is set to 4, which corresponds to the beginning of the first fragment header following the 4 byte DVB header. If there is a first fragment header located somewhere else within the data packet of the DVB data frame, the PID is set to a value corresponding to the offset from the start of the DVB data frame to the start of the first fragment header. If the data packet contains only data, with no first fragment header then the PID is set to a value of 252. In one embodiment valid PID values are multiples of 4, thereby aligning data on 4 byte boundaries.

As discussed previously, data formatted as described in FIG. 7 is transmitted by the hub station 104 over the forward link 110 to the satellite 106. The satellite receives the data from the forward link 110 and re-transmits them on a forward downlink 112. The remote units 108A to 108N monitor one or more channels which comprise the forward link in order to receive remote-unit specific data or broadcast data from the hub station 104.

When data formatted as described in FIG. 7 is received by a remote unit, the PID field 618 in the DVB header is read. If the PID value is between 8 and 180, the receiver knows that a first fragment header begins at this location within the data segment of the DVB data frame, with the data located between the beginning of the data packet and the first fragment header containing data from the preceding MAC data frame. If the PID value is 4, the first fragment header is located at the start of the data packet of the DVB data frame. If the PID value is 252, there is no first fragment header and all the data in the data packet belongs to the preceding MAC data frame. Thus the only DVB data frames which have a PID value of 252 are intermediate DVB data frames, containing fragments of a MAC data frame which spans multiple DVB frames, or the last DVB data frame of a fragmented MAC frame that has less than 8 bytes available in the data packet section of the DVB data frame. If there are at least 8 bytes available in the data packet of a DVB data frame, and there is no more MAC data ready to transmit, a first fragment header is added to the DVB data packet with a length field set to zero, indicating to the receiver that there is no more data presently being transmitted.

If there is a first fragment header in the data packet portion of the DVB data frame, the receiver parses the first fragment header for the destination address 630, and the packet length 626. The destination address 630 identifies which remote unit the transmission is intended for. The packet length field 626 represents the number of bytes contained in the MAC data field 504. Thus, using the length of the MAC data field the receiver is able to reassemble the original message.

Figure 8:
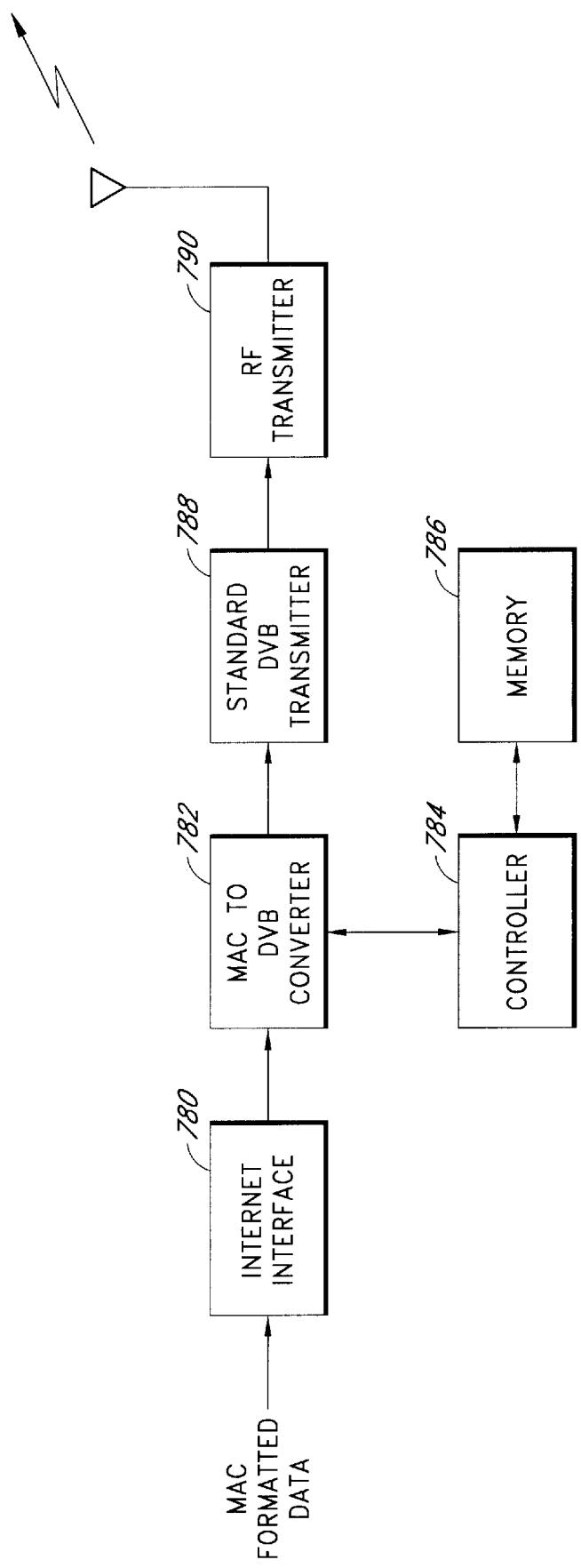
FIG. 8 is a block diagram of a transmitter system of a hub station.

FIG. 8 is a block diagram of a hub station transmitter system. The transmitter system comprises an Internet interface 780, a MAC to DVB converter 782, a controller 784, memory 786, a standard DVB transmitter 788 and a RF transmitter 790. The Internet interface 780 receives MAC formatted data from the Internet. The Internet interface 780 provides any buffering or signal conditioning required by the hardware interface to the Internet. The output of the Internet interface 780 is passed to the MAC to DVB converter 782. Using the procedure described above, the MAC to DVB converter 782 formats the MAC data frames into DVB data frames. The controller 784 is in communication with the MAC to DVB converter 782. The controller 784 may be, for example, a microprocessor, an application specific integrated circuit (ASIC), a field programmable gate array (FPGA), discrete logic, an analog circuit, or other control circuitry. Communication between the controller 784 and the MAC to DVB converter 782 allows the controller 784 to monitor the data transmission process such as, for example, detecting errors and detecting if a message is directed to the hub station rather than to a remote unit through the RF link. The controller 784 is also in communication with memory 786 so that if a message from the Internet was directed to the hub station, the controller 784 can direct that message to memory 786 or take appropriate action as required by the message. The output of the MAC to DVB converter 782 is passed to a standard DVB transmitter 788. The standard DVB transmitter 788 prepares the DVB frame for transmission over the wireless link. The output of the standard DVB transmitter 788 is transferred to the RF transmitter 790. The RF transmitter interfaces to an antenna 792 and transmits the DVB data frame over the wireless link to the remote units.

Figure 9:
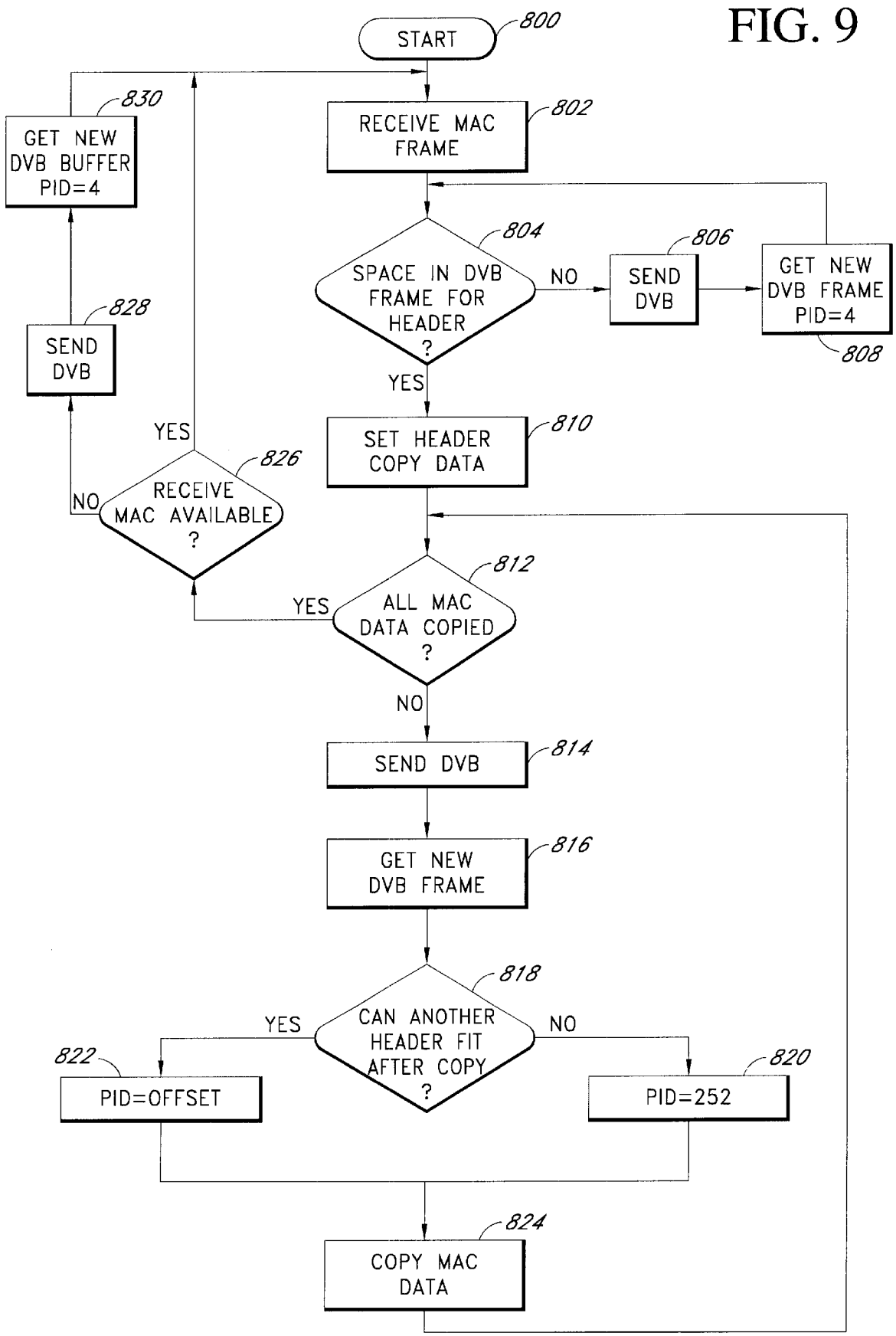
FIG. 9 is a flowchart describing the steps executed in the conversion of a MAC data frame into a DVB data frame.

FIG. 9 is a flowchart describing the packetizing of a MAC data frame into a DVB data frame performed by the hub station. The process starts in block 800. In block 802, a MAC data frame is received from the network access layer. Flow continues to block 804, where the amount of space available in the current DVB data packet is determined. If there are not at least 8 bytes available in the data packet, flow continues to block 806. In block 806 the data packet is sent. In block 808 the process advances to the next DVB frame and the PID is set equal to a value of 4 indicating that the MAC frame is starting at the beginning of the DVB frame. Flow then continues back to block 804. In block 804 if there are at least 8 bytes available in the data packet floe continues to block 810. In block 810, the header and data are copied from the MAC frame to the DVB frame. In block 812, it is determined if all the MAC data, from the MAC frame being processed, has been copied. If all the MAC data has not been copied flow continues to block 814. In block 814 the DVB frame is transmitted. Flow continues to block 816 where the process advances to the next DVB frame.

Flow then continues to block 818 where it is determined if after the remaining MAC data is copied to the DVB frame, will there be sufficient space remaining in the DVB frame for another header. If there will not be sufficient space remaining after the remaining MAC data is copied flow continues to block 820. In block 820 the PID is set equal to a value of 252 indicating that the entire DVB frame contains data from the same MAC frame. If in block 818 it is determined that there will be sufficient space remaining in the DVB frame after all the MAC data is copied flow continues to block 822. In block 822 the PID is set to a value equal to the number of bytes from the beginning of the DVB data frame to where a new MAC frame will begin. After the PID value is set in either block 820 or 822 flow continues to block 824. In block 824 the MAC data is copied to the DVB frame. Flow then continues to block 812.

In block 812 if it is determined all the MAC data, from the MAC frame being processed, has not been copied flow continues to block 826. In block 826 it is determined if there are additional MAC frames available to be processed. If there are additional MAC frames available to be processed flow continues to block 802. If there are no additional MAC frames available flow continues to block 828. In block 828 the DVB frame being processed is transmitted. Flow then continues to block 830. In block 30 a new DVB frame is started, and the PID is set to a value of 4. Flow then continues to block 802.

Figure 10:
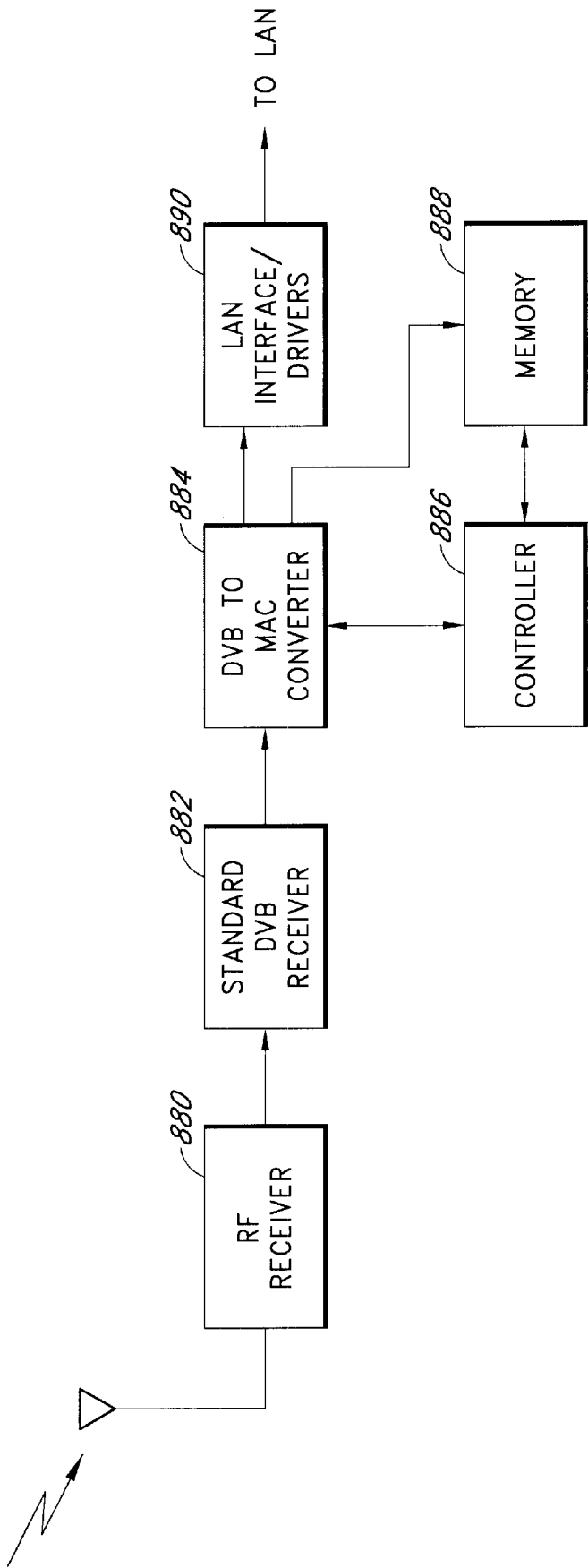
FIG. 10 is a block diagram of a receiver system of a remote unit.

FIG. 10 is a block diagram of a DVB receiver section of a remote unit. The DVB receiver section comprises an RF receiver 880, a standard DVB receiver 882, a DVB to MAC converter 884, a controller 886, memory 888 and a LAN interface/driver is 890. The RF receiver 880 receives the wireless communication transmitted by the hub station. The output of the RF receiver 880 is passed to the standard DVB receiver 882. The standard DVB receiver 882 formats the data into DVB data frames. Data transmitted by the hub station is formatted to comply to the industry standard DVB format. As noted above, using the PID field to indicate the location of the start of a MAC from within the DVB data frame permits use of a standard DVB receiver. Use of the PID field does not interfere with normal operation of the DVB receiver. Use of fields other than the PID field may cause errors or otherwise make the DVB receiver inoperable. As noted above, use of standard DVB receivers has several advantages, such as, for example, the reduced cost of the high volume standard receiver as compared to custom designs, and the ability to easily incorporate new advances in DVB receiver technology as they become available. Standard DVB receiver chips may be used, such as, for example, MITEL VP305, VP306 or any other receiver chip which complies with the DVB standard.

The output of the standard DVB receiver 882 is passed to the DVB to MAC converter 884. In the DVB to MAC converter 884, the DVB data frame is defragmented into the original MAC data frame that was transmitted by the hub station as explained with reference to FIG. 11. The controller 886 is in communication with the DVB to MAC converter 884. Communication between the controller 886 and the DVB to MAC converter 884 allows the controller 886 to monitor data reception by the remote unit. The controller 886 monitors, such as, for example, errors in the received message and if the message was directed to the remote unit or to be transferred to the LAN. The controller is also in communication with memory 880. If a transmission is intended for the remote unit, such as, for example, a software upgrade for the remote unit, the controller 886 detects that the message is intended for the remote unit and directs the DVB to MAC converter 884 to route the message to memory 888. Messages that are intended for the LAN pass from the DVB to MAC converter 884 to the LAN interface/driver 890. LAN interface/driver 890 provides signal conditioning and the required interface and driver circuitry to interface the remote unit to a LAN. The controller may be, for example, a microprocessor, an application specific integrated circuit (ASIC), a field programmable gate array (FPGA), discrete logic, an analog circuit, or other control circuitry.

Figure 11:
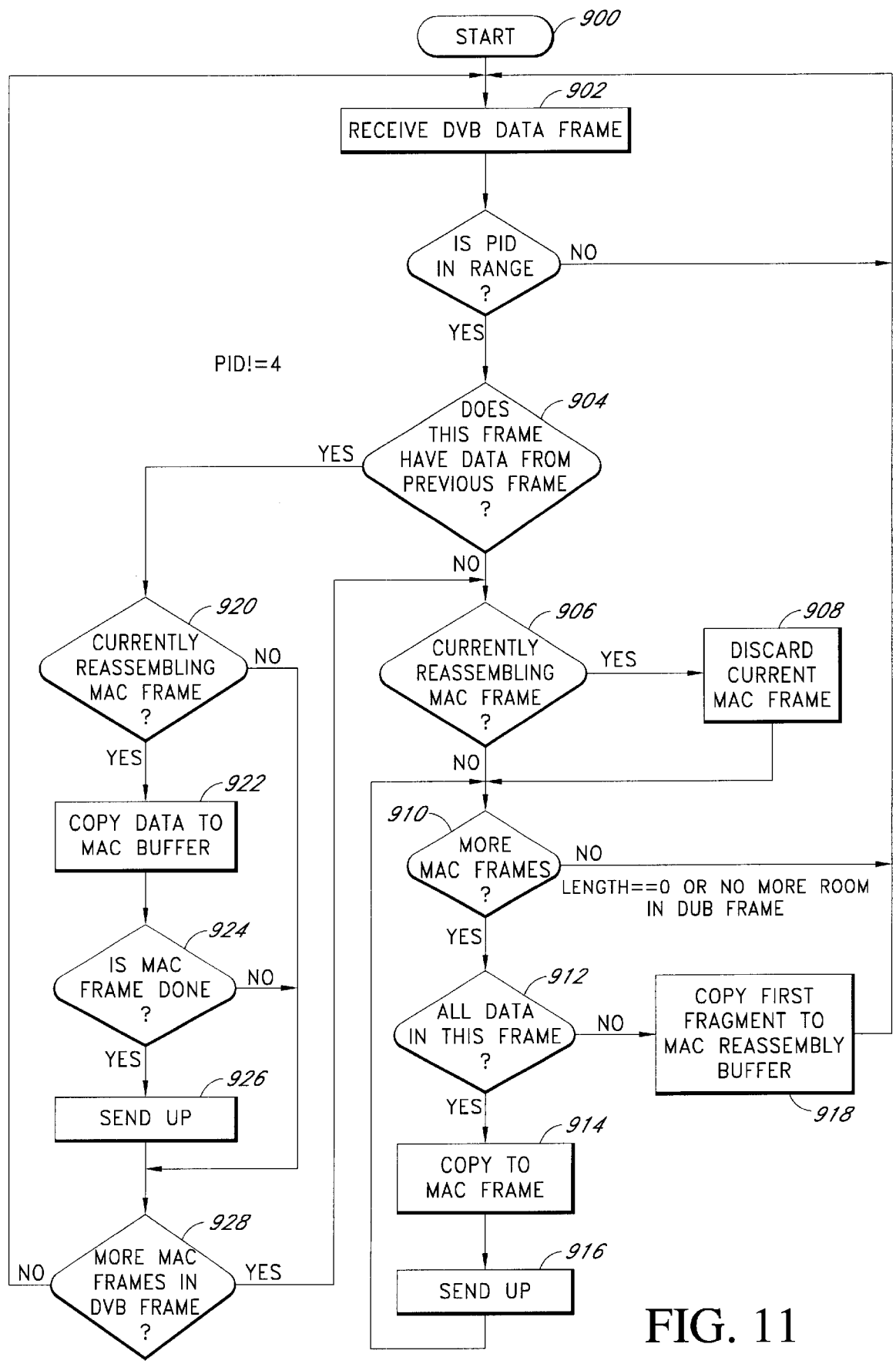
FIG. 11 is a flowchart describing the steps executed in the conversion of a DVB data frame into a MAC data frame.

FIG. 11 is a flowchart describing the defragmentation of a MAC data frame formatted into a DVB data frame performed by the remote unit. The process starts at block 900. In block 902 a DVB data frame is received. Flow continues to block 904, where it is determined if the DVB frame received contains data which is a continuation from the MAC data contained in the previous DVB frame. If the DVB frame received does not contain data which is a continuation of the MAC data contained in the previous DVB frame flow continues to block 906. In block 906 it is determined if a MAC frame defragmentation, or reassembly, is in process. If a MAC frame reassembly is in process flow continues to block 908. In block 908 the MAC frame which is being reassembled is discarded. The frame is discarded because the reassembly process is not complete, however, the DVB frame received does not contain data which is a continuation from the MAC data from the previous frame. In the manner described, a remote unit is able to synchronize itself to an incoming data stream if the remote unit is coming online initially, following a remote unit reset, or if a DVB data frame is lost or corrupted. Flow then continues to block 910.

If in block 906 it is determined that a MAC frame reassembly is not in process flow continues to block 910. In block 910 it is determined if there are more MAC frames in the DVB frame being processed. If there are no more MAC frames in the DVB frame, as indicated by a length field of zero or the end of the DVB frame has been reached, then flow continues to block 902. If it is determined that there are more MAC frames in the DVB frame being processed flow continues to block 912. In block 912 it is determined if the entire MAC frame is contained in the DVB frame being processed. If the entire MAC frame is contained in the DVB frame being processed flow continues to block 914. In block 914 the data from the DVB frame is copied to the MAC frame. In block 916 the completed MAC frame is sent to the IP layer. Flow then continues to block 910. If in block 912 it is determined the entire MAC frame is not contained in the DVB frame being processed, but spans multiple DVB frames, flow continues to block 918. In block 918 the first fragment of the MAC frame is copied to a MAC reassembly buffer. Flow then continues to block 902 to receive the next DVB frame.

Returning to block 904, if the DVB frame received does contain data which is a continuation of the MAC data contained in the previous DVB frame flow continues to block 920. In block 920 it is determined if a MAC frame reassembly is in process. If a MAC frame reassembly is in process flow continues to block 922. In block 922 the MAC data from the DVB frame is copied to the MAC reassembly buffer. Flow continues to block 924 where it is determined if the MAC frame is complete as indicated by a PID value not equal to 252 or if there is data remaining in the DVB frame. If the MAC frame is complete flow continues to block 926. In block 926 the MAC frame is sent to the IP layer. Flow then continues to block 928. If, in block 924, it is determined that the MAC frame is not complete flow continues to block 928. Returning to block 920, if it is determined a MAC frame reassembly is not in process flow continues to block 928.

In block 928 it is determined if there are more MAC frames in the DVB frame being processed. If there is additional MAC data in the DVB frame being processed flow continues to block 906. If there is no additional MAC data in the DVB frame being process flow continues to block 902.

The invention may be embodied in other specific forms without departing from its spirit or essential characteristics. The described embodiment is to be considered in all respects only as illustrative and not restrictive and the scope of the invention is, therefore, indicated by the appended claims rather than the foregoing description. All changes which come within the meaning and range of equivalency of the claims are to be embraced within their scope.

What is claimed is:

1. A system for providing Internet service comprising:

a plurality of remote units that communicate through a satellite link;

a hub station in communication with the satellite and in communication with a plurality of content servers; and wherein data from the content servers is communicated to the hub station via the Internet, and said data is transmitted from the hub station to the plurality of remote units via the satellite link with the data formatted to comply with Digital Video Broadcast (DVB) standard, and wherein the Internet data is formatted within DVB frames such that fragment headers occur at variable locations within the DVB frames, and stored within the DVB frame is a value indicating location of the fragment header within the DVB frame.

2. The system of claim 1, wherein the plurality of remote units are in communication with a plurality of end users.

3. The system of claim 1, wherein the value is contained in the PID field of the DVB frame.

4. In a communication system in which a hub station transmits data to a plurality of remote units, a method of communicating comprising:

accepting a block of Internet data from a network by the hub station;

transmitting the block of Internet data from the hub station to the plurality of remote units over a satellite communication channel conforming to Digital Video Broadcast (DVB) standard, wherein the Internet data is formatted within DVB frames such that fragment headers occur at variable locations within the DVB frames, and stored within the DVB frame is a value indicating location of the fragment header within the DVB frame; and receiving the block of Internet data transmitted from the hub station by the plurality of remote units.

5. The method of claim 4, wherein the value is contained in the PID field of the DVB frame.

6. A method of formatting TCP/IP data for transmission over a link using Digital Video Broadcast (DVB) standard comprising:

accepting MAC frames which contain the TCP/IP data;

formatting the MAC frames within DVB frames such that fragment headers occur at a variable location within the DVB frames;

storing, within the DVB frames, position location which specifies the location of the fragment header within the DVB frame;

transmitting the DVB frame from a hub station over a satellite link; and receiving the DVB frame transmitted from the hub station by a plurality of remote units.

7. The method of claim 6, wherein the MAC frames are Ethernet frames.

8. The method of claim 6, wherein the position location is contained in a PID field in the DVB frame.

* * * * *